United States Patent
Shimogawa et al.

(10) Patent No.: US 8,054,705 B2
(45) Date of Patent: Nov. 8, 2011

(54) SEMICONDUCTOR INTEGRATED CIRCUIT

(75) Inventors: Kenjyu Shimogawa, Kanagawa (JP); Hiroshi Furuta, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 106 days.

(21) Appl. No.: 12/458,428

(22) Filed: Jul. 13, 2009

(65) Prior Publication Data

US 2010/0034039 A1   Feb. 11, 2010

(30) Foreign Application Priority Data

Aug. 7, 2008   (JP) .................. 2008-204510

(51) Int. Cl.
*G11C 7/06* (2006.01)
(52) U.S. Cl. ................... 365/205; 365/233.5
(58) Field of Classification Search ........... 365/205, 365/233.5
See application file for complete search history.

(56) References Cited

U.S. PATENT DOCUMENTS

| | | | | |
|---|---|---|---|---|
| 6,128,237 A * | 10/2000 | Shirley et al. | ................ | 365/207 |
| 6,545,902 B2 * | 4/2003 | Sakata et al. | ................ | 365/145 |
| 6,813,207 B2 | 11/2004 | Honda | | |
| 7,237,175 B2 | 6/2007 | Hatakenaka et al. | | |
| 7,535,785 B2 * | 5/2009 | Kim | ................ | 365/222 |
| 2005/0068833 A1 * | 3/2005 | Choi | ................ | 365/222 |
| 2008/0016392 A1 * | 1/2008 | Earl et al. | ................ | 714/6 |
| 2008/0052565 A1 * | 2/2008 | Oku | ................ | 714/702 |
| 2008/0084770 A1 * | 4/2008 | Lee | ................ | 365/194 |

FOREIGN PATENT DOCUMENTS

| | | |
|---|---|---|
| JP | 62-150590 | 7/1987 |
| JP | 2003-077294 A | 3/2003 |
| JP | 2003-272390 A | 9/2003 |
| JP | 2007-157283 A | 6/2007 |

* cited by examiner

*Primary Examiner* — Michael Tran
(74) *Attorney, Agent, or Firm* — Foley & Lardner LLP

(57) ABSTRACT

A semiconductor integrated circuit has K (K is a natural number of 2 or more) number of memory cells coupled to a same word line, and multiple sense amplifier circuits coupled to the memory cells. The multiple sense amplifier circuits are divided into N (N is a natural number of 2 or more) number of groups. Among the N number of groups, after a first group of sense amplifier circuits is activated and carrying out a predetermined read-out operation, a second group of the sense amplifier circuits is activated and the predetermined read-out operation is carried out, and an Nth group of the sense amplifier circuits is activated sequentially to carry out the predetermined read-out operation.

3 Claims, 5 Drawing Sheets

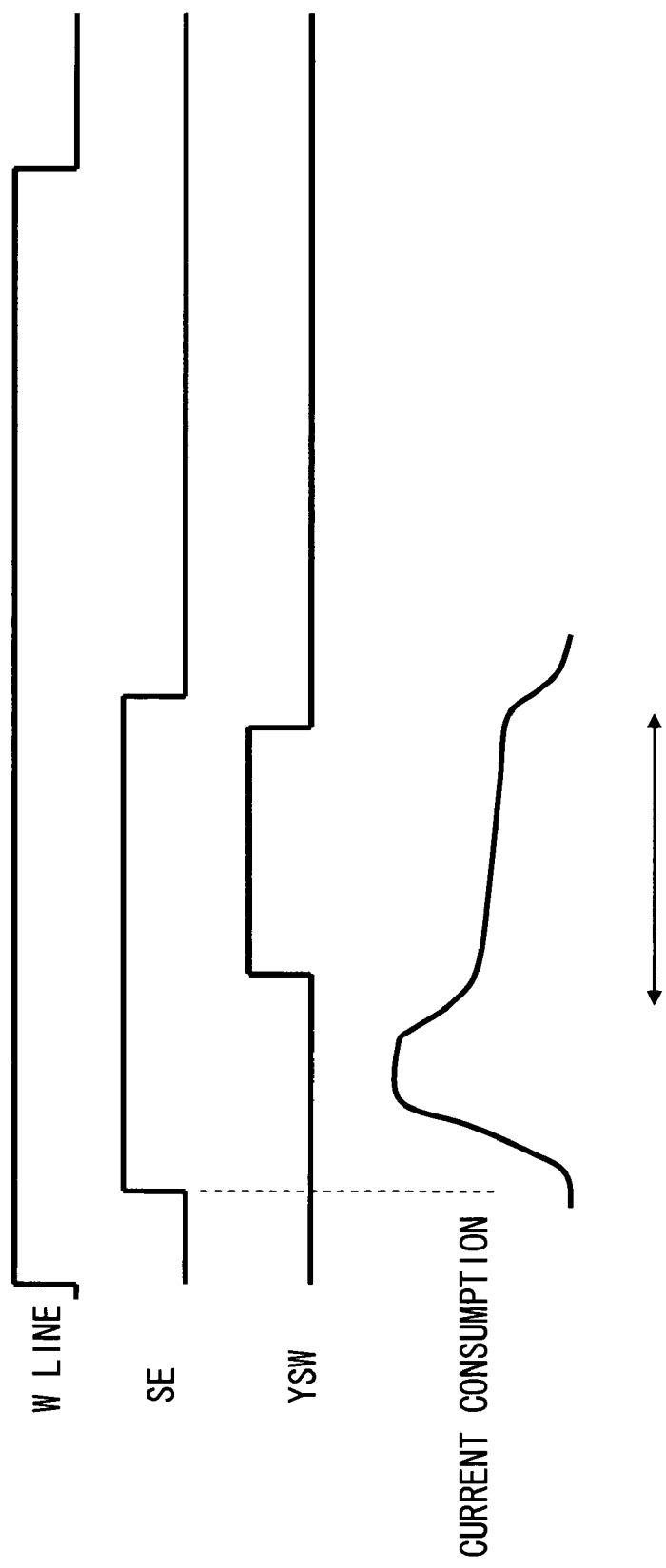

SEMICONDUCTOR INTEGRATED CIRCUIT

BACKGROUND

1. Field of the Invention

The present invention relates to a semiconductor integrated circuit, and particularly to a semiconductor integrated circuit having a sense amplifier (hereinafter referred to as SA) which operates when multiple bits are read out at the same time from memory cells connected to a word line (hereinafter referred to as W line).

2. Description of Related Art

Some memory products require to read out multiple bits at the same time. In such memory products, if cells to be read out are connected to the same W line, SAs of the number of the bits operates simultaneously. The power consumption at this time (operating power of the SAs) must be reduced. Reducing the power consumption is important especially at a parallel output of multiple bits.

Soft error measures at the time of simultaneous read-out of memory cells connected to one W line is required as a technique concerning the simultaneous read-out of multiple bits. Especially important is measures to 2-bit errors that cannot be corrected by a normal ECC (Error Checking and Correcting) circuit.

An operation of SA according to related arts when outputting multiple cells at the same time, which are connected to one W line, is disclosed in Japanese Unexamined Patent Application Publication Nos. 2003-272390 (Honda), 2007-157283 (Shimada), and 62-150590 (Miyazawa). The technique disclosed by Honda divides cells into multiple groups to form multiple SA groups. These SA groups do not start operating at the same time but start operating at different time from each other. This enables to reduce the peak current when the SAs are operating.

The technique disclosed by Shimada also divides cells into multiple SA groups and shifts operation timings of the SA groups according to clocks. This enables to reduce the peak current when the SAs are operating. The technique disclosed by Miyazawa divides cells into multiple SA groups and arranges them so that the SA groups not operating simultaneously are connected to a common W line by an appropriate layout spatially and temporally.

As a normal ECC circuit, 1-bit error correcting and 2-bit error detecting circuit is used. This is referred to as a an SEC-DED (Single Error Correction-Double Error Detection). Measures to an error of 2 bits or more which cannot be corrected in the ECC circuit are disclosed by Japanese Unexamined Patent Application Publication No. 2003-077294 (Hatanaka et al). The technique disclosed by Hatanaka et al. divides ECC circuits into multiple groups so that data from memory cells (SA output) connected to each ECC circuit group become data of every three cells. There is extremely small possibility that two cells which are 4 cells away from each other are erroneous simultaneously. Thus the ECC circuit may only be a normal ECC circuit which can correct 1-bit error in substance. However, in the technique disclosed by Hatanaka et al., SAs do not divide the cells.

In the relates arts disclosed by Honda, Shimada, and Miyazawa, the SA groups are not started to operate simultaneously, thereby enabling to suppress the current from flowing at the same time as the SA groups start to operate. However, there is a time zone when multiple SA groups are operating simultaneously. In this document, this time zone is referred to as stable operation time to differentiate from operation start time.

In the stable operation time shown in FIG. 2 for Honda, t1' to t2' in FIG. 2 for Shimada, and FIG. 4 for Miyazawa, multiple SA groups are operating at the same time. Such techniques prevent a large current as at the operation start time from flowing, however currents still flows in each SA group. The related arts do not see a problem in the current value when multiple SA groups are operating simultaneously (at the stable operation time, not the operation start time for SA group). If there are not many SA groups, the operation start time of the SA groups can be shifted so that there is no problem in the current at the stable operation time when the SA groups are operating.

However, in the case of reading out 100 bits (100 SAs for DRAM) at the same time, the current at the stable operation time is non-negligible in which many SA groups are operating simultaneously, although it depends on how many of SA groups are divided into a group. That is, it is not a problem even if a few SA groups are operating simultaneously at the stable operation time. However if the SA groups increase from 4 to 8, superimposed current at the stable operation time is non-negligible in which multiple SA groups are operating simultaneously FIG. 4 shows a circuit diagram of a memory array according to a related art. 128 cells are connected to one W line as shown in FIG. 4. Each SA is connected to respective bit line. The SAs are activated in response to an SA activation signal SE. Further, a particular bit line is selected by a bit line selection signal YSW, read-out data from a cell amplified by the SA is transmitted to a Local I/O bus, and the read-out data is input to a data amplifier (DAMP).

FIG. 5 shows an operation timing chart of a memory array of FIG. 4. As shown in FIG. 5, an SA is activated by an activation signal SE. Then a bit line is selected by a bit line selection signal YSW. A current for charging and discharging the bit line is consumed immediately after activating the SA. After the bit line selection signal YSW is released, the Local I/O bus is charged and discharged. As the memory capacity increases, the load capacity of this Local I/O bus also increases, thereby increasing the period in which the charging and discharging current flows.

SUMMARY

The present inventors have found a problem that in the semiconductor integrated circuit of the related arts, multiple SA groups operates at the same time and the current consumption increases.

A first exemplary aspect of an embodiment of the present invention is a semiconductor integrated circuit that includes K (K is a natural number of 2 or more) number of memory cells coupled to a same word line, and a plurality of sense amplifier circuits coupled to the memory cells. The plurality of sense amplifier circuits are divided into N (N is a natural number of 2 or more) number of groups. Among the N number of groups, after a first group of sense amplifier circuits is activated and carrying out a predetermined read-out operation, a second group of the sense amplifier circuits is activated and the predetermined read-out operation is carried out, and an Nth group of the sense amplifier circuits is activated sequentially to carry out the predetermined read-out operation. As the multiple sense amplifier groups do not operate simultaneously at the stable operation time of the sense amplifiers, it is possible to prevent from generating a superimposed current.

The present invention provides a semiconductor integrated circuit in which multiple SA groups do not operate simultaneously and thereby enabling to reduce the current consumption. Additionally, the present invention provides a semiconductor integrated circuit that reduces 2-bit errors as much as possible, which cannot be corrected by a normal ECC circuit.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 5 is a timing chart for explaining the problem of the semiconductor integrated circuit of the related art.

DETAILED DESCRIPTION OF THE EXEMPLARY EMBODIMENTS

First Exemplary Embodiment

Figure 1:
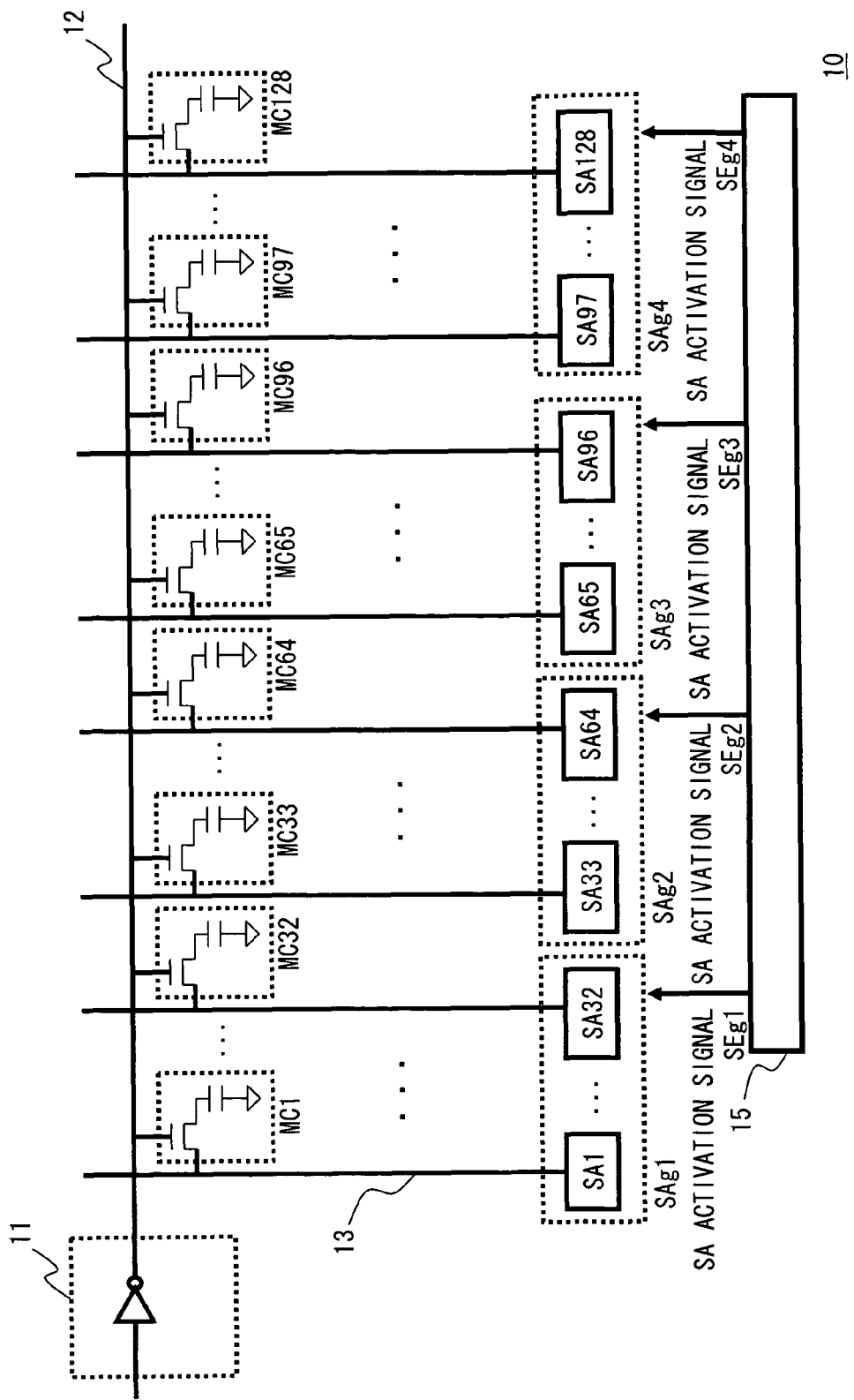
FIG. 1 illustrates the configuration of a semiconductor integrated circuit according to a first exemplary embodiment.

The configuration of a semiconductor integrated circuit according to a first exemplary embodiment of the present invention is explained with reference to FIG. 1. FIG. 1 illustrates the configuration of a semiconductor integrated circuit 10 according to this embodiment. An example of a memory cell array having 128 cells (bits) being connected to one word line (W line) is used here. In FIG. 1, the cells are not displayed separately. In the case of a DRAM, the numbers of memory cells are same as that of sense amplifiers.

The semiconductor integrated circuit 10 of this embodiment includes a W line driver circuit 11, a W line 12, bit lines 13, memory cells MC1 to MC128, sense amplifiers SA1 to SA128, and a sense amplifier control circuit 15. The W line driver circuit 11 is connected to the W line 12. The W line 12 and multiple bit lines 13 are arranged to cross each other. In FIG. 1, 128 bit lines 13 are provided to correspond to the number of memory cells MC1 to MC128 are placed at the intersections of the W line 12 and the bit lines 13. A memory cell consists of one transistor and one capacitor. The W line 12 is connected to a gate of the transistor. The bit line 13 is connected to either a source or a drain, and a capacitor is connected to the other. For convenience, the memory cells are referred to as MC1, MC2 . . . , and MC128 from the closest one to the W line driver circuit 11. The sense amplifiers SA1 to SA128 are connected to the respective bit lines 13.

In this embodiment, 32 cells are grouped to one SA group, thereby making 4 SA groups. These SA groups are referred to as SAg1, SAg1, SAg2, SAg3, and SAg4 from the closest one to the W line driver circuit 11. MC to MC32 are connected to SAg1, MC33 to MC64 are connected to SAg2, MC65 to MC96 are connected to SAg3, and MC97 to MC128 are connected to SAg4. Multiple SAs of SAg1 to SAg4 are separately activated in response to SA activation signals SEg1 to SEg4 respectively, which are output from the sense amplifier control circuit 15. Each SA group reads out data in response to the activation signals.

Figure 2:
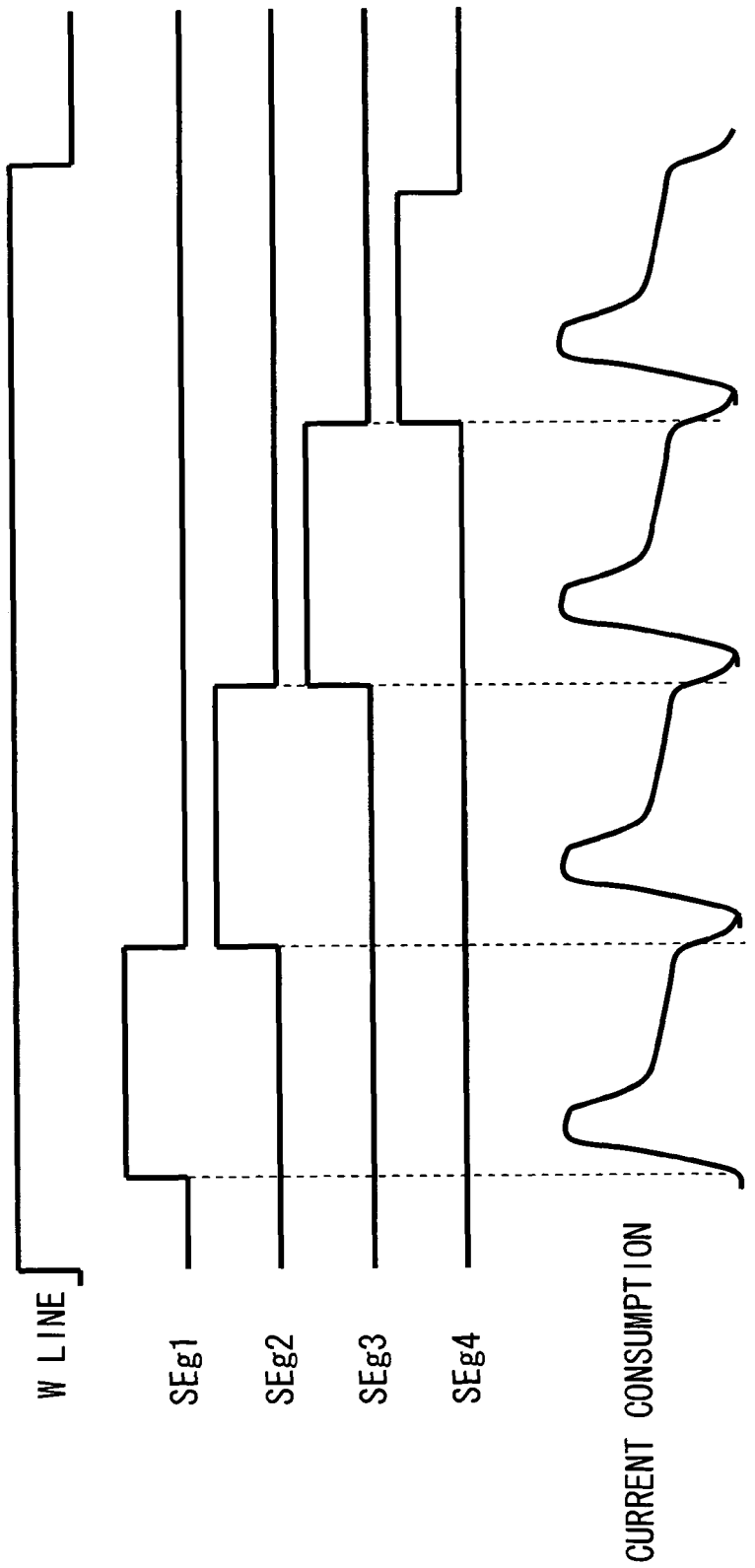
FIG. 2 is a timing chart for explaining an operation of the semiconductor device according to the first exemplary embodiment.

The operation of the semiconductor integrated circuit 10 is explained with reference to FIG. 2. FIG. 2 is a timing chart for explaining the operation of the semiconductor integrated circuit 10 according to this embodiment. In FIG. 2, the horizontal axis represents time and the vertical axis represents potential or current. As shown in FIG. 2, when the target W line is selected, firstly SAg1 is activated in response to the SA activation signal SEg1 to carry out a predetermined read-out operation. After SAg1 is activated, SAg2, which is to be activated after SAg1, is activated in response to the SA activation signal SEg2 to carry out a predetermined read-out operation. The following SAg3 and SAg4 are activated in the similar way after the previous SA groups are activated.

In FIG. 2, a delay component in the rising/falling time of the activation signals SEg1 to SEg4 are not clearly illustrated. However in order for the sense amplifier circuit to be activated, activation (operation start) time exists during the rising time from L to H, and similarly deactivation (operation end) time exists during the falling time from H to L. In the present invention, SEg1 to SEg4 signals are determined in consideration of the rising and the falling time.

Thus, in the semiconductor integrated circuit 10 of this embodiment, only one SAg (SA group) is activated sequentially. That is, there is no period when multiple SA groups are activated simultaneously. Therefore, the peak operating current and the operation stable current for the activation of only one SAg (SA group) are consumed. This enables to reduce the peak current and the SA operation stable current at the same time.

Such circuit that activates multiple SA groups sequentially can be realized by a general sequential circuit or the like. The operation of the previous SA group is completed at the timing when an activation of each SA group is switched and the operation of the following SA group is not started. Therefore, there is no overlapped time when multiple SA groups are activated and the consumption current of the multiple SA groups are not superimposed.

The reason to start the operations from SAg1, which is the closest SA group to the W line driver circuit 11, sequentially to the farthest SA group. Immediately after selecting the W line to which many cells are connected, a potential difference of the W line 12 is generated between the closest group and the farthest group to the W line driver circuit 11. As the potential of the W line 12 is a gate potential of the selected transistor, the potential of the W line 12 is desired to be a predetermined potential. The potential of the W line 12 near the W line driver circuit 11 reaches to the predetermined potential before the potential of the W line 12 far from the W line driver circuit 11. Therefore, in order for an SA to carry out stable read-out of data, the SA should start reading out from the one closest to the W line driver circuit 11.

The number of cells included in one SA group (which is same as the number of SAs as for DRAM) is determined by a peak current at the operation start time and the current at the stable operation time according to the product specifications. In this embodiment, the number of SA groups to divide into groups is 4. but it is not limited to this. Increasing the number of SA groups slows down the access speed but reduces the power consumption. Reducing the number of SA group increases the access speed but also increases the power consumption. The configuration can be determined according to the number of cells to read out simultaneously which are connected to one W line 12 and the specifications such access speed and power consumption of the product, for example.

The above explanation used DRAM cells as an example, however the embodiment can be applied in the similar way for other memories such as SRAM or even a memory embedded LSI. In the case of DRAM, the number of memory cells and the number of all the SAs are the same numbers. However in the case of SRAM, multiple memory cells are connected to one SA. Accordingly, in the case of SRAM, the number of memory cells exceeds the number of all sense amplifiers provided in the semiconductor integrated circuit. Thus, assume that the number of memory cells is K and Ks number of sense amplifiers are provided in the N number of groups. Then the formula Ks×N<=K will be satisfied.

Second Exemplary Embodiment

Figure 3:
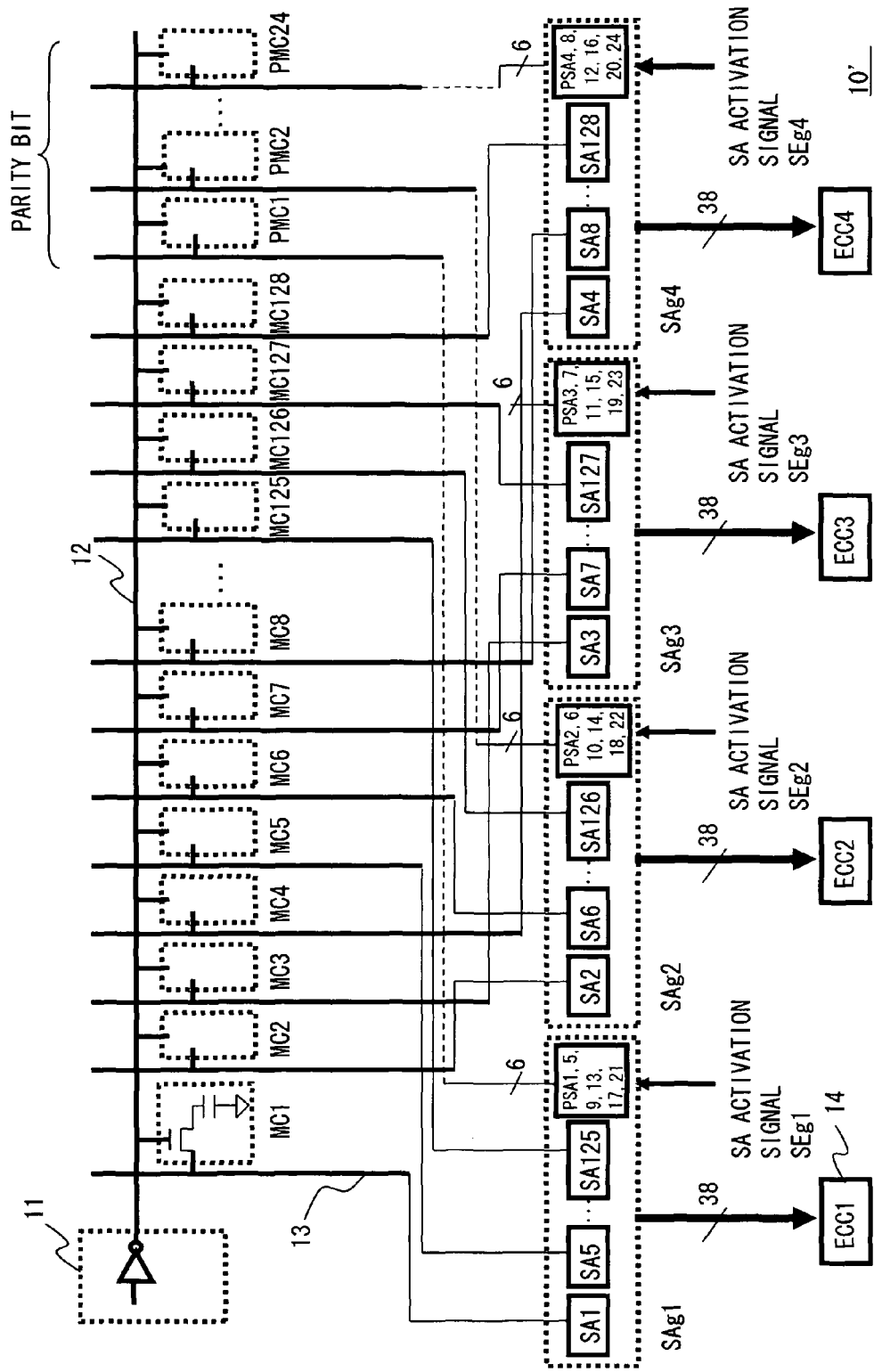
FIG. 3 illustrates the configuration of a semiconductor integrated circuit according to a second exemplary embodiment.
Figure 4:
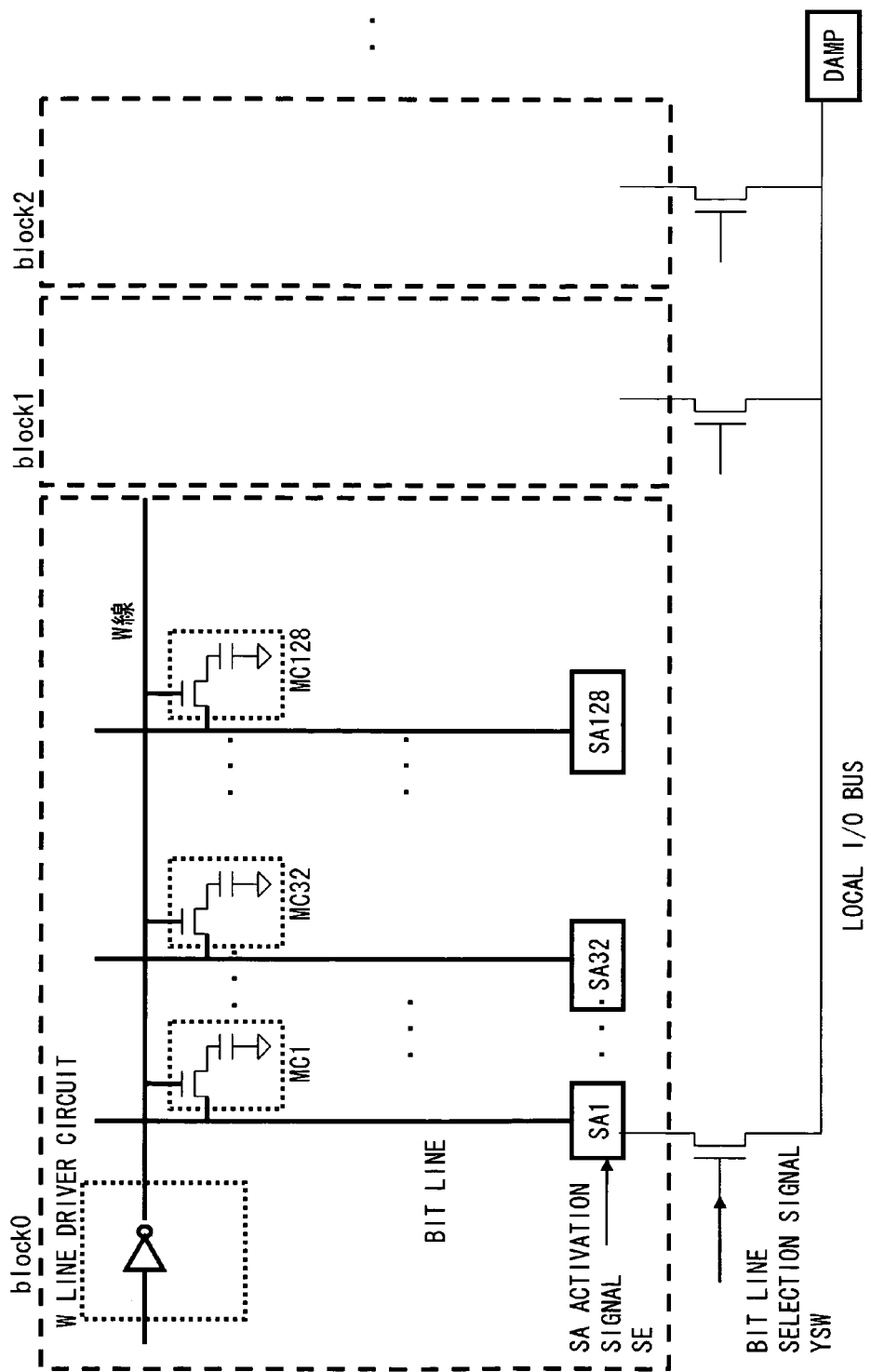
FIG. 4 illustrates the configuration of a semiconductor integrated circuit according to a related art.

The configuration of the semiconductor integrated circuit according to a second exemplary embodiment of the present invention is explained with reference to FIG. 3. FIG. 3 explains the configuration of a semiconductor integrated circuit 10' according to this embodiment. The integrated circuit 10' shown in FIG. 3 is a modification of the semiconductor integrated circuit 10 according to the first exemplary embodiment. In the semiconductor integrated circuit 10', 128 cells are connected to one W line 12. An example where the number of SA groups is 4 and 32 cells are connected to one SA group is explained hereinafter. In FIG. 3, components identical to those in FIG. 1 are denoted by reference numerals identical to those therein with detailed description omitted.

The semiconductor integrated circuit 10' according to this embodiment includes a W line driver circuit 11, a W line 12, bit lines 13, memory cells MC1 to MC128, sense amplifiers SA1 to SA128, parity bit cells PMC1 to PMC24, parity bit sense amplifiers PSA1 to PSA 24, and ECC circuits 14. The W line 12 and multiple bit lines 13 are arranged to cross each other. In this example, 128+24 of the bit lines 13 are provided to correspond with the number of memory cells and the number of parity bit cells.

MC1 to MC128 are placed at the intersections of the W line 12 and the bit lines 13. As described above, a memory cell consists of one transistor and one capacitor. The W line 12 is connected to a gate of the transistor. The bit line 13 is connected to either a source or a drain and a capacitor is connected to the other. For convenience, the memory cells are referred to as MC1, MC2 . . . , and MC128 from the closest one to the W line driver circuit 11.

The sense amplifiers SA1 to SA128 are connected to the respective bit lines 13. In this embodiment, 32 cells are grouped to one SA group, thereby making 4 SA groups. These SA groups are referred to as SAg1, SAg1, SAg2, SAg3, and SAg4 from the closest one to the W line driver circuit 11.

MC1, MC5, MC9, . . . , and MC125 are connected to SAg1. MC2, MC6, MC10, . . . , and MC126 are connected to SAg2. MC3, MC7, MC11, . . . , and MC127 are connected to SAg3. MC4, MC8, MC12, . . . , and MC128 are connected to SAg4. That is, every 3 memory cells are connected to each SA group. In other words, the adjacent memory cells connected to SAg1 are connected to the SA group different from SAg1. In FIG. 3, the relationship between the SA groups and the memory cells are not illustrated in detail. In the case of DRAM, the numbers of memory cells are same as the number of sense amplifiers.

The parity bit cells PMC1 to PMC24, which are used in the ECC circuits 14, are connected to the W line 12. There are 6 bits×4=24 parity bit cells (24 cells) being provided. Further, 6 bits (6 cells) of the parity bit cells are connected to each of the SA groups. The parity bit cells are read out at the same time as the other cells in one SA group.

PMC1, PMC5, . . . , and PMC21 are connected to SAg1. PMC2, PMC6, . . . , and PMC22 are connected to SAg2. PMC3, PMC7, . . . , and PMC23 are connected to SAg3. PMC4, PMC8, . . . , and PMC24 are connected to SAg4. That is, every 3 memory cells are connected to each SA group. In other words, adjacent memory cells are connected to different SA groups.

The data output from each SA group is output to the ECC circuits 14. As shown in FIG. 3, there are 4 ECC circuits 14 (ECC1 to ECC4). SAg1 is connected to ECC1, SAg2 is connected to ECC2, SAg3 is connected to ECC3, and SAg4 is connected to ECC4. A normal 1 bit error correction and 2 bit error detection (SEC-DED) can be used for the ECC circuits 14.

As with the first exemplary embodiment, the operation of the SA groups in the semiconductor integrated circuit 10' of this embodiment is that the SA groups are activated in order starting from SAg1 and after completing to activate SAg1, the following SAg2 is activated. Therefore, as mentioned above, only the peak operating current and the operation stable current of one SAg (SA group) at activation time are consumed in all the period. This enables to reduce the peak current and SA operation stable current at the same time.

The data output from each SA group is input to the ECC circuits 14 to be checked and corrected for errors (ECC process). Accordingly, in the present invention, the memory cells provided to one W line 12 is divided into groups to be checked and corrected for errors by each group. According to this embodiment, data of every 3 cells is input to each of the ECC circuit 14. There is small possibility that two cells which are 3 cells (address number) away from each other are erroneous simultaneously. Each of the ECC circuits 14 can correct 1 bit error. Therefore, the present invention enables to correct an error of 2 or more bits by the ECC circuits 14, which is an SEC-DED.

The relationship between the number of SA groups m, the number of parity bits (the number of parity cells) k, and the number of ECC circuits is described hereinafter, which is related to this embodiment. Increasing the number of SA groups reduces the necessary parity bits for one SA group. However, since the parity bit of k×m is necessary as the whole memory cell array, the whole number of parity bits increases. The number of ECC circuits provided are same as the SA group m.

The number of parity bit cells is explained below. Suppose that the number of memory cells is K and the number of groups to divide SAs into groups is N, K/N bits are read out from one W line 12 in each SA group at the same time. When satisfying $K/N=2^x$ (x is a positive integer) at this time, each SA group requires parity bits of x+1. Therefore, in this case, x+1 parity bit cells are connected to each group.

On the other hand, if K/N is not expressed with a power of 2. it can be expressed as $2^x<K/N<2^{x+1}$ (x is a positive integer). In this case, generally n+2 parity bits are required. Further, in order to have as least parity bits as possible, memory cells are allocated so that as many groups as possible (usually N−1) satisfy $K/N=2^x$ (x is a positive integer). In this case, x+1 parity bit cells are connected to N−1 groups among each group. Then, the remaining groups satisfy $2^x<K/N<2^{x+1}$ (x is a positive integer), and x+2 parity bit cells are connected to the corresponding groups.

For example, if 128 cells are connected to one W line 12 as in this embodiment, 32 cells will be connected to each SA group when the number of the SA groups is 4. In this case, since the number of the memory cells is $2^5$, 5+1=6 bits of parity bits are required. Thus parity bits of 6×4=24 are required in total. If the number of SA groups is 2, 64 cells are connected to each SA group. In this case, as the number of memory cells is $2^6$, 6+1=7 bits of parity bits are required. Thus parity bits of 7×2=14 are required in total.

On the other hand, if 144 cells are connected to one W line 12 and if the number of SA group is 4, 36 cells are connected to each SA group. In this case, the number of memory cells is $2^5 < 144/4 = 4 + 2^5 < 2^6$. In this case, $2^5$ cells are allocated to three groups and 5+1=6 bits of parity bits are required. The remaining one group requires 5+2=2 bits of parity bits. Accordingly, the number of parity bits can be reduced.

This relationship can be modified appropriately according to the number of cells connected to one W line 12 and product specifications. The number of cells (bits) included in each group may all be K/N. However the number of cells included in a particular group may be smaller or lager than K/N depending on how the groups are divided.

As explained above, this embodiment achieves to reduce power consumption as with the first exemplary embodiment. This embodiment also reduces 2-bit errors that cannot be handled by a normal ECC circuit (SEC-DED) as much as possible.

In this embodiment, memory cell data processed by each ECC circuit 14 is the data of 4 cells away from each other. Thus there is extremely small possibility that the data is inverted (2 bit error). Therefore, it can be handled by a normal (SEC-DED) ECC circuit.

A memory cell upset is explained hereinafter. There are two phenomena caused by nuclear radiation that can be considered for an unset of memory cells of 2 bits or more. One phenomenon is the case where a radiation enters once (hit once) and multiple memory cells are upset at the same time. When assuming that the soft error rate, i.e. SER, of having a 1-bit error is 1. SER of a 2-bit simultaneous error is 2 digits smaller than 1. It is noted that this value varies according to the memory cells of the product and the conditions such as radiation irradiation.

The SER for a 3-bit error is 1 digit smaller than the SER for a 2-bit error. In addition, among errors of 2 bits or more, the SER for an error of 2 bits or more of a simultaneous read-out W line is further smaller. The possibility to have a 2-bit error can be extremely small (substantially 0) if non-adjacent memory cells are to be checked and corrected for their errors (ECC process) as in the present invention.

The other phenomena is the case where a 1-bit error is generated in a certain point and not corrected or rewritten. Then there is another erroneous cell generated in a W line which includes the previous erroneous cell. This is an accumulated 2-bit error. This cannot be handled even by locating the memory cells to check and correct for their errors away from each other, as in the present invention. However, it will not be a problem if the error is checked and corrected at the stage of 1-bit error. It can be said that in a normal RAM, which will not be used as in ROM but is repeatedly read and written, there is small possibility that the accumulated 2-bit error is generated.

As explained above, in this embodiment, if there are many cells to be read out simultaneously from one W line 12, the sense amplifiers to be operated simultaneously are divided into multiple groups. Then, after the operation of one sense amplifier group, next sense amplifier group is operated. Therefore, in the present invention, multiple sense amplifier groups are not activated simultaneously. This enables to reduce the power consumption.

The sense amplifier groups are activated in order from the closest one to the W line driver 11 to the farthest one. This enables to stabilize reading out from each memory cell. The memory cells connected to the sense amplifier groups are assigned to each sense amplifier group in a way that the memory cells are spaced apart for a predetermined number of cells. By providing the ECC circuit to each sense amplifier group, errors of 2 bits or more can be reduced.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
K number of memory cells coupled to a same word line;
a plurality of sense amplifier circuits coupled to the memory cells, wherein the plurality of sense amplifier circuits are divided into N number of groups,
K and N are natural numbers of 2 or more,
among the N number of groups, after a first group of sense amplifier circuits is activated and carrying out a predetermined read-out operation, a second group of the sense amplifier circuits is activated and the predetermined read-out operation is carried out, and
an Nth group of the sense amplifier circuits is activated sequentially to carry out the predetermined read-out operation;
an ECC circuit that inputs data read out from the N number of groups to carry out an ECC process; and
a parity bit cell for the ECC process, the parity bit cell being connected to the word line,
wherein
if $K/N < 2^x$ is satisfied, x+1 number of the parity bit cells are connected to each of the groups,
if $2^x < K/N < 2^{x+1}$ is satisfied, x+1 number of the parity bit cells are connected to N−1 number of groups among the groups and x+2 number of the parity bit cells are connected to a remaining one group, and
x is a positive integer.

2. A semiconductor integrated circuit, comprising:
a plurality of memory cells coupled to a selected word line;
a first sense amplifier group and a second sense amplifier group coupled to the memory cells; and
a control circuit coupled to the first and the second sense amplifier groups to control operation timing of the first and the second sense amplifier groups in response to the selected word line,
wherein the control circuit suspends an operation of the first sense amplifier groups no later than an activation of the second sense amplifier.

3. The semiconductor integrated circuit according to claim 2, wherein the control circuit controls so that operation time of the sense amplifier in the first and the second sense amplifier groups is not overlapped.

* * * * *